United States Patent
Sato

(10) Patent No.: US 10,090,137 B2
(45) Date of Patent: Oct. 2, 2018

(54) IN—CE—O-BASED SPUTTERING TARGET AND METHOD FOR PRODUCING THE SAME

(71) Applicant: SUMITOMO METAL MINING CO., LTD., Tokyo (JP)

(72) Inventor: Keiichi Sato, Ome (JP)

(73) Assignee: SUMITOMO METAL MINING CO., LTD., Tokyo (JP)

(*) Notice: Subject to any disclaimer, the term of this patent is extended or adjusted under 35 U.S.C. 154(b) by 111 days.

(21) Appl. No.: 14/892,653

(22) PCT Filed: Mar. 25, 2014

(86) PCT No.: PCT/JP2014/058259
§ 371 (c)(1),
(2) Date: Nov. 20, 2015

(87) PCT Pub. No.: WO2014/203579
PCT Pub. Date: Dec. 24, 2014

(65) Prior Publication Data
US 2016/0104608 A1 Apr. 14, 2016

(30) Foreign Application Priority Data

Jun. 17, 2013 (JP) ................................ 2013-126313

(51) Int. Cl.
*C23C 14/14* (2006.01)
*H01J 37/34* (2006.01)
(Continued)

(52) U.S. Cl.
CPC ............ *H01J 37/3429* (2013.01); *B22F 3/16* (2013.01); *B22F 9/026* (2013.01); *B22F 9/04* (2013.01);
(Continued)

(58) Field of Classification Search
CPC .......... H01J 37/3429; B22F 3/16; B22F 9/026; B22F 9/04; C04B 35/01; C04B 34/6261;
(Continued)

(56) References Cited

U.S. PATENT DOCUMENTS

2004/0081836 A1* 4/2004 Inoue ...................... C04B 35/01
428/469
2007/0209928 A1 9/2007 Inoue
(Continued)

FOREIGN PATENT DOCUMENTS

EP 1731629 A1 12/2006
JP H09-176841 7/1997
(Continued)

OTHER PUBLICATIONS

International Search Report for International Application No. PCT/JP2014/058259 dated Jul. 1, 2014.
(Continued)

*Primary Examiner* — John Joseph Brayton
(74) *Attorney, Agent, or Firm* — Kratz, Quintos & Hanson, LLP

(57) ABSTRACT

[Object] To provide: an In—Ce—O-based sputtering target capable of suppressing nodules and abnormal discharge over a long period, even though the Ce content based on an atomic ratio of Ce/(In+Ce) is 0.16 to 0.40, at which a high-refractive-index film can be obtained; and a method for producing the In—Ce—O-based sputtering target. [Solving Means] The sputtering target is an In—Ce—O-based sputtering target which is made of an In—Ce—O-based oxide sintered body containing indium oxide as a main component and cerium, and which is used in producing a transparent conductive film having a refractive index of 2.1 or more. The target is characterized in that the Ce content based on the atomic ratio of Ce/(In+Ce) is 0.16 to 0.40, and that cerium
(Continued)

oxide particles having a particle diameter of 5 μm or less are dispersed in the In—Ce—O-based oxide sintered body.

6 Claims, 1 Drawing Sheet

(51) Int. Cl.
*C23C 14/08* (2006.01)
*C23C 14/34* (2006.01)
*C04B 35/01* (2006.01)
*C04B 35/626* (2006.01)
*B22F 3/16* (2006.01)
*B22F 9/02* (2006.01)
*B22F 9/04* (2006.01)
*C23C 14/58* (2006.01)

(52) U.S. Cl.
CPC .......... *C04B 35/01* (2013.01); *C04B 35/6261* (2013.01); *C23C 14/086* (2013.01); *C23C 14/3414* (2013.01); *C23C 14/5806* (2013.01); *B22F 2302/25* (2013.01); *B22F 2304/10* (2013.01); *C04B 2235/3229* (2013.01); *C04B 2235/3286* (2013.01); *C04B 2235/5445* (2013.01); *C04B 2235/785* (2013.01); *C04B 2235/786* (2013.01); *C04B 2235/80* (2013.01); *C04B 2235/9646* (2013.01)

(58) Field of Classification Search
CPC .............. C23C 14/086; C23C 14/3414; C23C 14/5806
See application file for complete search history.

(56) References Cited

U.S. PATENT DOCUMENTS

2011/0147676 A1* 6/2011 Abe .................. C04B 35/01
252/512
2013/0200314 A1* 8/2013 Sogabe ................ C04B 35/453
252/519.5

FOREIGN PATENT DOCUMENTS

| JP | 3445891 B2 | 9/2003 |
| JP | 2005-126766 A1 | 5/2005 |
| JP | 2005-243187 A1 | 9/2005 |
| JP | 2005-290458 A1 | 10/2005 |
| JP | 2005-320192 A1 | 11/2005 |

OTHER PUBLICATIONS

Extended European Search Report dated Jul. 7, 2016 for corresponding European application No. 14813940.5.

* cited by examiner

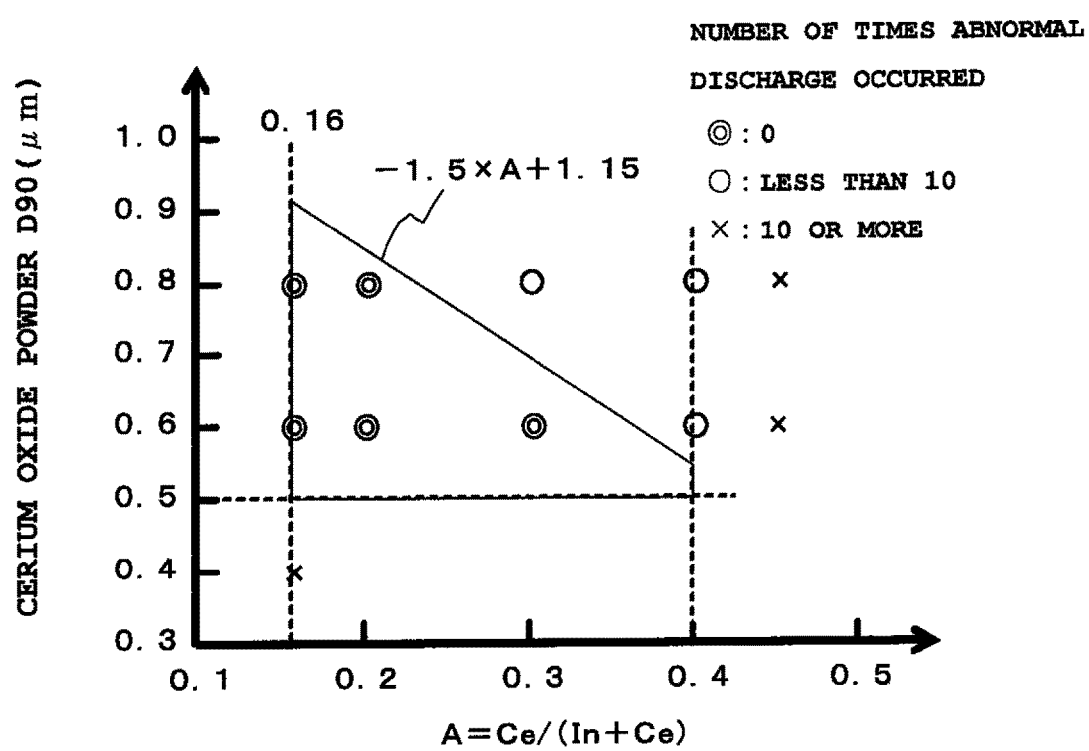

IN—CE—O-BASED SPUTTERING TARGET AND METHOD FOR PRODUCING THE SAME

TECHNICAL FIELD

The present invention relates to an In—Ce—O-based sputtering target for use in producing a transparent conductive film which has a refractive index of 2.1 or more, and which is applicable to display elements of a liquid-crystal display, an organic electroluminescent display, and so forth, as well as solar cells, light-emitting diodes, and the like. Particularly, the present invention relates to an In—Ce—O-based sputtering target capable of preventing abnormal discharge (arcing) during production of a transparent conductive film, and a method for producing the In—Ce—O-based sputtering target.

BACKGROUND ART

It has been known that a film obtained by adding cerium (Ce) to indium oxide has a high refractive index and is a useful material in designing an optical film.

For example, Patent Document 1 discloses a sputtering target containing 10 to 40% by mass cerium oxide and the balance of indium oxide, that is, an In—Ce—O-based sputtering target having an atomic ratio of Ce relative to In and Ce in total, Ce/(In+Ce), set in a range of 0.082 to 0.35. The use of such a sputtering target makes it possible to obtain a film having a refractive index of 2.0 or more (the film is for protecting an optical disc).

Meanwhile, the sputtering target is prepared from an In—Ce—O-based oxide sintered body obtained by sintering a powder mixture of an indium oxide raw material powder and a cerium oxide raw material powder having been molded into a compact by cold isostatic pressing. However, if the sputtering target prepared in this manner is used for a long period, this brings about problems that nodules are likely to be formed on the target surface, and that abnormal discharge occurs.

Moreover, Patent Document 2 describes an In—Ce—C-based sputtering target having an atomic ratio of Ce relative to In and Ce in total, Ce/(In+Ce), set in a range of 0.005 to 0.15, in which cerium oxide particles dispersed in indium oxide have a diameter of 5 μm or less, so that the aforementioned abnormal discharge can be prevented.

Nevertheless, in order to obtain an optical film having a high refractive index (the refractive index is, for example, 2.1 or more), Ce needs to be added in a large amount. It is stated that, in increasing the amount of Ce added, if Ce/(In+Ce) exceeds the upper limit of 0.15, the particle diameter of the cerium oxide particles exceeds 5 μm, causing abnormal discharge (see paragraph 0028 of Patent Document 2). Hence, increasing the amount of Ce added results in such a problem that it is difficult to obtain a favorable sputtering target capable of preventing abnormal discharge.

CONVENTIONAL ART DOCUMENTS

Patent Documents

Patent Document 1: Japanese Patent Application Publication No. 2005-243187 (see claims)
Patent Document 2: Japanese Patent Application Publication No. 2005-290458 (see claims)

SUMMARY OF THE INVENTION

Problems to be Solved by the Invention

The present invention has been made in view of such problems as described above. An object of the present invention is to provide an In—Ce—O-based sputtering target capable of suppressing the above-described nodule formation on the target surface, thereby preventing abnormal discharge, even when the In—Ce—O-based sputtering target has an atomic ratio of Ce relative to In and Ce in total, that is, Ce/(In+Ce), exceeding the above-described upper limit of 0.15. Together provided is a method for producing the In—Ce—O-based sputtering target.

Means for Solving the Problems

The present inventor has earnestly studied to achieve the above object. As a result, the inventor has found out that even if an atomic ratio of Ce relative to In and Ce in total, Ce/(In+Ce), is within a range of 0.16 to 0.40 exceeding 0.15, subjecting a raw material powder to a finer pulverizing process makes it possible to prepare an In—Ce—O-based oxide sintered body in which cerium oxide particles have a crystal particle diameter of 5 μm or less detected by an EPMA (Electron Probe Micro Analyzer) analysis; as a result, the above-described nodule formation on the target surface is suppressed, so that arcing can be suppressed.

Specifically, a first aspect according to the present invention is an In—Ce—O-based sputtering target which is made of an In—Ce—O-based oxide sintered body containing indium oxide as a main component and cerium, and which is used in producing a transparent conductive film having a refractive index of 2.1 or more, characterized in that a Ce content based on an atomic ratio of Ce/(In+Ce) is 0.16 to 0.40, and cerium oxide particles having a particle diameter of 5 μm or less are dispersed in the In—Ce—O-based oxide sintered body.

A second aspect of the present invention is the In—Ce—O-based sputtering target according to the first aspect, characterized in that the In—Ce—O-based oxide sintered body has a relative density of 95% or more, and a specific resistance of from 7 mQ·cm or more to 50 mQ·cm or less.

Next, a third aspect of the present invention is a method for producing the In—Ce—O-based sputtering target according to the first aspect, characterized in that the production method comprises:

a cerium-oxide-powder grinding step of grinding a cerium oxide raw material powder by a wet grinding method until a 90% cumulative particle diameter (D90) determined from a particle size distribution reaches from 0.5 μm or more to 1.0 μm or less;

a mixture-powder-slurry grinding step of grinding a mixture powder slurry by the wet grinding method until a 90% cumulative particle diameter (D90) determined from a particle size distribution reaches from 0.7 μm or more to 1.0 μm or less, the mixture powder slurry obtained by mixing the ground cerium oxide powder with an indium oxide raw material powder;

a granulated-powder producing step of obtaining a granulated powder by adding an organic binder to the ground mixture powder slurry, followed by spray drying;

a compact producing step of obtaining a compact by press-molding the obtained granulated powder; and a sintered-body producing step of obtaining an In—Ce—O-based oxide sintered body by sintering the obtained compact.

A fourth aspect of the present invention is the method for producing the In—Ce—O-based sputtering target according to the third aspect, characterized in that the 90% cumulative particle diameter (D90) of the cerium oxide powder determined from the particle size distribution in the cerium-oxide-powder grinding step satisfies 0.5 (μm)≤D90≤−1.5× A+1.15 (μm), where A represents the atomic ratio of Ce/(In+Ce) (provided that 0.16≤A≤0.40).

Effects of the Invention

The In—Ce—O-based sputtering target according to the present invention is characterized in that the Ce content based on the atomic ratio of Ce/(In+Ce) is 0.16 to 0.40, and that the cerium oxide particles having a particle diameter of 5 μm or less are dispersed in the In—Ce—O-based oxide sintered body.

Moreover, even in the In—Ce—O-based sputtering target having an atomic ratio of Ce/(In+Ce) of 0.16 to 0.40, at which a high-refractive-index film can be obtained, film formation stable and capable of suppressing nodules and abnormal discharge over a long period is possible by a DC sputtering method. Thus, the present invention makes it possible, as an effect, to provide a high-quality, high-refractive-index transparent conductive film at low cost in an industrial scale.

BRIEF DESCRIPTION OF DRAWING

FIG. 1 is a graph showing a relation between Ce/(In+Ce) and a cerium oxide powder.

MODES FOR PRACTICING THE INVENTION

Hereinafter, embodiments of the present invention will be described in detail.

(1) In—Ce—O-Based Sputtering Target

First of all, in an In—Ce—O-based sputtering target according to the present invention, the atomic ratio of Ce relative to In and Ce in total, that is, Ce/(In+Ce) is set in a range of 0.16 to 0.40 in order to produce a high-refractive-index transparent conductive film having a refractive index of 2.1 or more.

Moreover, in order to suppress nodule formation and abnormal discharge over a long period, the crystal particle diameter of cerium oxide particles in an In—Ce—O-based oxide sintered body detected by an EPMA analysis is adjusted to 5 μm or less.

Here, the crystal particle diameter of the cerium oxide particles in the In—Ce—O-based oxide sintered body is measured by the EPMA analysis as follows.

First, the obtained In—Ce—O-based oxide sintered body is cut. After the cross section is polished, this cross section is observed with EPMA, and an elemental analysis is conducted on the surface of the sintered body in a frame of 50 μm×50 μm square to obtain a mapping image. From the obtained mapping image, cerium oxide particles are identified to measure the largest diameter in the observed cerium oxide particles. Subsequently, an average value is calculated from the largest diameters in cerium oxide particles similarly measured on the surface of the sintered body at, for example, three positions within the frame. This average value is determined as the crystal particle diameter of the cerium oxide particles.

Moreover, the In—Ce—O-based oxide sintered body preferably has a relative density of 95% or more. Note that the relative density refers to a density relative to the theoretical density, which is taken as 100%. The theoretical density is a value of a weighted average of "the theoretical density of indium oxide" and "the theoretical density of cerium oxide" obtained by using amounts of raw material powders introduced. Further, 7.18 g/cm$^3$ is used as "the theoretical density of indium oxide," and 7.215 g/cm$^3$ is used as "the theoretical density of cerium oxide." Note that if the relative density of the In—Ce—O-based oxide sintered body is less than 95%, nodules are formed due to voids present in the sintered body, causing abnormal discharge in some cases.

Next, the In—Ce—O-based oxide sintered body preferably has a specific resistance of from 7 mΩ·cm or more to 50 mΩ·cm or less. This is because if the specific resistance exceeds 50 mΩ·cm, the discharge stability in DC sputtering deteriorates, causing abnormal discharge (arcing) in some cases. Note that the lower limit (7 mΩ·cm) of the specific resistance is determined for the following reason. Specifically, in the In—Ce—O-based oxide sintered body according to the present invention, the Ce content based on the atomic ratio of Ce/(In+Ce) is 0.16 to 0.40; the composition having such a high content makes it realistically difficult to prepare an In—Ce—O-based oxide sintered body having a specific resistance of less than 7 mΩ·cm.

(2) Method for Producing In—Ce—O-Based Sputtering Target

In the present invention, even though the In—Ce—O-based oxide sintered body has an atomic ratio of Ce relative to In and Ce in total, that is, Ce/(In+Ce) exceeding 0.15, the crystal particle diameter of cerium oxide particles dispersed in the sintered body is adjusted to 5 μm or less in order to suppress nodule formation and thereby prevent abnormal discharge (arcing) during a sputtering film deposition.

In order to make the crystal particle diameter 5 μm or less, a cerium oxide raw material powder is ground by a wet grinding method using a wet bead mill or the like until a 90% cumulative particle diameter (D90) determined from a particle size distribution reaches from 0.5 μm or more to 1.0 μm or less. Then, the ground cerium oxide powder is mixed with an indium oxide raw material powder to obtain a mixture powder slurry, and the mixture powder slurry is ground by the wet grinding method using a wet bead mill or the like until a 90% cumulative particle diameter (D90) determined from a particle size distribution reaches from 0.7 μm or more to 1.0 μm or less. Next, an organic binder is added to the ground mixture powder slurry, followed by spray drying to obtain a granulated powder. Further, the obtained granulated powder is press-molded to produce a compact, and this compact is sintered to thus prepare an In—Ce—O-based oxide sintered body in which the crystal particle diameter of cerium oxide particles is adjusted to 5 μm or less.

Note that, in a method adopted to produce a common sputtering target (In—Ce—O-based oxide sintered body), an indium oxide raw material powder and a cerium oxide raw material powder are mixed and ground together as described in Patent Documents 1 and 2 above.

However, when a cerium oxide raw material powder is ground for a long period for the pulverization, it is likely that an indium oxide raw material powder is brought into an excessively ground state due to a difference in relative easiness of grinding from the cerium oxide powder. Moreover, such an indium oxide raw material powder in an excessively ground state causes abnormal grain growth during the sintering, making it difficult to increase the density of the In—Ce—O-based oxide sintered body. As a result, nodule formation and abnormal discharge are likely to occur.

For these reasons, the present invention adopts the method in which: at first, a cerium oxide raw material powder is solely ground by a wet grinding method with a bead mill, a ball mill, or the like; then, the ground cerium oxide powder is mixed with an indium oxide raw material powder; and the mixture powder is further ground by the wet grinding method using the obtained mixture powder slurry. This method enables the pulverization of the cerium oxide powder without excessively grinding the indium oxide powder. In addition, the grinding period can be reduced in comparison with the case of grinding both of an indium oxide raw material powder and a cerium oxide raw material powder because only the cerium oxide raw material powder is ground at first; moreover, it is possible to reduce impurity contamination derived from wearing of a grinding medium further than ever achieved.

Meanwhile, if the cerium oxide raw material powder is ground until the 90% cumulative particle diameter (D90) determined from the particle size distribution reaches less than 0.5 μm, the cerium oxide powder is brought into an excessively ground state, and causes abnormal grain growth during the sintering, decreasing the density of the In—Ce—O-based oxide sintered body, while increasing the crystal particle diameter of the cerium oxide particles in the sintered body. This results in nodules and abnormal discharge. In contrast, if the cerium oxide raw material powder is ground in such a manner that the 90% cumulative particle diameter (D90) exceeds 1.0 μm, the crystal particle diameter of the cerium oxide particles in the In—Ce—O-based oxide sintered body exceeds 5 μm, resulting in nodules and abnormal discharge. For these reasons, it is necessary to grind the cerium oxide raw material powder by a wet grinding method until the 90% cumulative particle diameter (D90) determined from the particle size distribution reaches from 0.5 μm or more to 1.0 μm or less.

Further, as can be seen from the graph in FIG. 1 showing a relation between Ce/(In+Ce) and a cerium oxide powder, it is more preferable to grind the cerium oxide powder in such a manner that the 90% cumulative particle diameter (D90) of the cerium oxide powder determined from the particle size distribution is adjusted to be within the following range, where A is the Ce content based on the atomic ratio of Ce/(In+Ce) (provided that 0.16≤A≤0.40).

Specifically, it is more preferable to grind the cerium oxide powder until the 90% cumulative particle diameter (D90) of the cerium oxide powder determined from the particle size distribution in the cerium-oxide-powder grinding step satisfies 0.5 (μm)≤D90≤−1.5×A+1.15 (μm), where A represents the atomic ratio of Ce/(In+Ce) (provided that 0.16≤A≤0.40).

On the other hand, in a case where the above-described mixture powder slurry is ground until the 90% cumulative particle diameter (D90) determined from the particle size distribution reaches less than 0.7 μm, the cerium oxide powder is brought into an excessively ground state, and causes abnormal grain growth during the sintering, decreasing the density of the In—Ce—O-based oxide sintered body, while increasing the crystal particle diameter of the cerium oxide particles in the sintered body. This results in nodules and abnormal discharge. In addition, in the case where the mixture powder slurry is ground until the 90% cumulative particle diameter (D90) determined from the particle size distribution reaches less than 0.7 μm, this brings about problems that the productivity is decreased by the increase in the grinding period, and that impurities are increased due to wearing of a grinding medium. In contrast, if the mixture powder slurry is ground in such a manner that the 90% cumulative particle diameter (D90) exceeds 1.0 μm, the sintering is inhibited due to the presence of coarse particles, decreasing the density of the sintered body. This results in nodules and abnormal discharge. For these reasons, it is necessary to grind the above-described mixture powder slurry by a wet grinding method until the 90% cumulative particle diameter (D90) determined from the particle size distribution reaches from 0.7 μm or more to 1.0 μm or less.

Note that in a case where Ce/(In+Ce) exceeds 0.4, even when the mixture powder slurry is ground until the 90% cumulative particle diameter (D90) determined from the particle size distribution reaches 0.7 μm, the crystal particle diameter of the cerium oxide particles in the In—Ce—O-based oxide sintered body exceeds 5 μm, and nodule formation and abnormal discharge are likely to occur.

For this reason, the upper limit of the atomic ratio of Ce relative to In and Ce in total, that is, Ce/(In+Ce) has to be set at 0.4.

EXAMPLES

Hereinafter, Examples of the present invention will be described specifically together with Comparative Examples.

Example 1

An indium oxide raw material powder (purity: 99.9%, average particle diameter: 0.5 μm, D90: 1.0 μm) and a cerium oxide raw material powder (purity: 99.9%, average particle diameter: 0.8 μm, D90: 1.2 μm) were prepared. Note that a laser diffraction particle size distribution analyzer (manufactured by Shimadzu Corporation, SALD-2200) was used for measuring the particle size distributions.

First, the cerium oxide raw material powder was mixed with pure water to prepare a cerium oxide powder slurry having a solid content of 70%. In this event, a dispersant was added so as to disperse the cerium oxide raw material powder in the pure water. Next, the prepared cerium oxide powder slurry was ground using a bead mill by repeating the passing in such a manner that the 90% cumulative particle diameter (D90) determined from the particle size distribution reached 0.6 μm, so that a cerium oxide powder was obtained. In this event, zirconia beads (YTZ) 0.5 mm in diameter were used as the grinding beads in consideration of the wear resistance.

A slurry containing the cerium oxide powder thus ground and an indium oxide raw material powder were mixed with pure water in such a manner that the atomic ratio of Ce relative to In and Ce in total was Ce/(In+Ce)=0.30. Thereby, a mixture slurry of the indium oxide powder and the cerium oxide powder having a solid content of 70% was prepared. Next, the prepared cerium oxide-indium oxide mixture slurry was ground using the bead mill by repeating the passing in such a manner that the 90% cumulative particle diameter (D90) of the mixture powder contained in the mixture slurry reached 0.9 μm.

After the grinding, a binder (PVA) was added to the cerium oxide-indium oxide mixture slurry, and the resultant was spray dried by using a spray dryer (manufactured by OHKAWARA KAKOHKI CO., LTD., Model: ODL-20) to obtain a granulated powder.

The granulated powder was filled into a mold having a diameter of 180 mm, and a pressure of 294 MPa (3 ton/cm$^2$)

was applied thereto with a cold isostatic press. This pressure was held for 3 minutes to obtain a compact.

The compact was placed in a sintering furnace (an electric furnace manufactured by Marusho Denki Co., Ltd.), and sintered under conditions that the highest temperature was 1400° C. and the holding time was 30 hours. Thus, an In—Ce—O-based oxide sintered body was obtained.

The obtained In—Ce—O-based oxide sintered body had a relative density of 95.4%, and a specific resistance of 28 mΩ·cm.

Next, the obtained In—Ce—O-based oxide sintered body was cut. After the cross section was polished, this cross section was analyzed with an electron probe micro analyzer EPMA (manufactured by Shimadzu Corporation, EPMA-1600), and cerium oxide particles were observed. As a result of the measurement by the above-described method, the cerium oxide particles had a crystal particle diameter of 4.0 µm.

Moreover, the In—Ce—O-based oxide sintered body was cut to prepare a sputtering target having a size 4 inches (101.6 mm) in diameter and 5 mm in thickness.

Using the sputtering target, sputtering film deposition was carried out by a DC magnetron sputtering method. Although the sputtering film deposition was conducted for 5 hours, the number of times the cathode current was abnormally increased (the number of times abnormal discharge occurred) was zero. Further, a transparent conductive film formed by the sputtering film deposition had a refractive index of 2.2 at a wavelength of 550 nm. Tables 1-1 and 1-2 show these results.

Examples 2 to 4 and Comparative Example 1

Sputtering targets according to Examples 2 to 4 and Comparative Example 1 were obtained in the same manner as in Example 1, except that Ce/(In+Ce) was 0.16 (Example 2), 0.20 (Example 3), 0.40 (Example 4), and 0.45 (Comparative Example 1) in place of 0.30 in Example 1.

Then, using the sputtering targets according to Examples 2 to 4 and Comparative Example 1, the sputtering film deposition was conducted as in Example 1, and the number of times abnormal discharge occurred was recorded for each example. Tables 1-1 and 1-2 also show these results.

Examples 5 to 8 and Comparative Example 2

Sputtering targets according to Examples 5 to 8 and Comparative Example 2 were obtained in the same manner as in Example 1, except that: the 90% cumulative particle diameter (D90) of the cerium oxide powder determined from the particle size distribution was set to 0.8 µm differently from 0.6 µm in Example 1; and Ce/(In+Ce) was 0.16 (Example 5), 0.20 (Example 6), 0.30 (Example 7), 0.40 (Example 8), and 0.45 (Comparative Example 2).

Then, using the sputtering targets according to Examples 5 to 8 and Comparative Example 2, the sputtering film deposition was conducted as in Example 1, and the number of times abnormal discharge occurred was recorded for each example. Tables 1-1 and 1-2 also show these results.

Comparative Examples 3 to 8

Sputtering targets according to Comparative Examples 3 to 8 were obtained in the same manner as in Example 1, except that: the cerium oxide raw material powder was not solely ground, but the cerium oxide raw material powder and the indium oxide raw material powder were mixed and then ground together; although the 90% cumulative particle diameter (D90) of the mixture powder determined from the particle size distribution was 0.9 µm as in Example 1, Ce/(In+Ce) was 0.16 (Comparative Example 3), 0.20 (Comparative Example 4), 0.30 (Comparative Example 5), 0.40 (Comparative Example 6), 0.45 (Comparative Example 7), and 0.13 (Comparative Example 8).

Then, using the sputtering targets according to Comparative Examples 3 to 8, the sputtering film deposition was conducted as in Example 1, and the number of times abnormal discharge occurred was recorded for each example. Tables 1-1 and 1-2 also show these results.

Comparative Example 9

A sputtering target according to Comparative Example 9 was obtained in the same manner as in Example 1, except that: the 90% cumulative particle diameter (D90) of the cerium oxide powder determined from the particle size distribution was set to 0.4 µm differently from 0.6 µm; and Ce/(In+Ce) was 0.16 in place of Ce/(In+Ce)=0.30 in Example 1.

Then, using the sputtering target according to Comparative Example 9, the sputtering film deposition was conducted as in Example 1, and the number of times abnormal discharge occurred was recorded. Tables 1-1 and 1-2 also show this result.

Comparative Example 10

A sputtering target according to Comparative Example 10 was obtained in the same manner as in Comparative Example 3, except that the 90% cumulative particle diameter (D90) of the mixture powder determined from the particle size distribution was not 0.9 µm but 0.5 µm.

Then, using the sputtering target according to Comparative Example 10, the sputtering film deposition was conducted as in Example 1, and the number of times abnormal discharge occurred was recorded. Tables 1-1 and 1-2 also show this result.

TABLE 1-1

| | Ce/(In + Ce) | D90 (µm) of cerium oxide raw material powder | Grinding process on oxide cerium alone | D90 (µm) of mixture powder |
|---|---|---|---|---|
| Example 1 | 0.30 | 0.6 | performed | 0.9 |
| Example 2 | 0.16 | 0.6 | performed | 0.9 |
| Example 3 | 0.20 | 0.6 | performed | 0.9 |
| Example 4 | 0.40 | 0.6 | performed | 0.9 |
| Example 5 | 0.16 | 0.8 | performed | 0.9 |
| Example 6 | 0.20 | 0.8 | performed | 0.9 |
| Example 7 | 0.30 | 0.8 | performed | 0.9 |
| Example 8 | 0.40 | 0.8 | performed | 0.9 |
| Comparative Example 1 | 0.45 | 0.6 | performed | 0.9 |
| Comparative Example 2 | 0.45 | 0.8 | performed | 0.9 |
| Comparative Example 3 | 0.16 | 1.2 | not performed | 0.9 |
| Comparative Example 4 | 0.20 | 1.2 | not performed | 0.9 |
| Comparative Example 5 | 0.30 | 1.2 | not performed | 0.9 |
| Comparative Example 6 | 0.40 | 1.2 | not performed | 0.9 |
| Comparative Example 7 | 0.45 | 1.2 | not performed | 0.9 |
| Comparative | 0.13 | 1.2 | not | 0.9 |

TABLE 1-1-continued

|  | Ce/(In + Ce) | D90 (μm) of cerium oxide raw material powder | Grinding process on oxide cerium alone | D90 (μm) of mixture powder |
|---|---|---|---|---|
| Example 8 |  |  | performed |  |
| Comparative Example 9 | 0.16 | 0.4 | performed | 0.9 |
| Comparative Example 10 | 0.16 | 1.2 | not performed | 0.5 |

TABLE 1-2

|  | Particle diameter (μm) of cerium oxide in sintered body | Relative density (%) | Specific resistance (mΩ · cm) | Number of times abnormal discharge occurred | Refractive index |
|---|---|---|---|---|---|
| Example 1 | 4.0 | 95.4 | 28 | 0 | 2.2 |
| Example 2 | 2.0 | 96.8 | 7 | 0 | 2.1 |
| Example 3 | 2.8 | 96.1 | 14 | 0 | 2.1 |
| Example 4 | 4.7 | 95.1 | 47 | 1 | 2.3 |
| Example 5 | 3.1 | 96.1 | 19 | 0 | 2.1 |
| Example 6 | 3.6 | 95.4 | 26 | 0 | 2.1 |
| Example 7 | 4.5 | 95.3 | 41 | 1 | 2.2 |
| Example 8 | 5.0 | 95.1 | 49 | 2 | 2.3 |
| Comparative Example 1 | 5.2 | 93.3 | 78 | 21 | 2.3 |
| Comparative Example 2 | 5.5 | 90.5 | 110 | 30 | 2.3 |
| Comparative Example 3 | 5.3 | 94.7 | 65 | 12 | 2.1 |
| Comparative Example 4 | 5.6 | 93.3 | 85 | 23 | 2.1 |
| Comparative Example 5 | 6.5 | 91.9 | 100 | 40 | 2.2 |
| Comparative Example 6 | 7.0 | 90.5 | 110 | 64 | 2.3 |
| Comparative Example 7 | 8.0 | 89.1 | 110 | 101 | 2.3 |
| Comparative Example 8 | 4.8 | 94.9 | 62 | 1 | 2.0 |
| Comparative Example 9 | 10.8 | 86.2 | 120 | 420 | 2.1 |
| Comparative Example 10 | 4.9 | 83.6 | 130 | 51 | 2.1 |

(1) It was verified that transparent conductive films having a high refractive index (refractive index at a wavelength of 550 nm: 2.1 to 2.3) were obtained from the In—Ce—O-based sputtering targets according to Examples 1 to 8, in which the Ce content based on the atomic ratio of Ce/(In+Ce) was in a range of 0.16 to 0.40, and the cerium oxide particles having a particle diameter of 5 μm or less were dispersed in the In—Ce—O-based oxide sintered body. Further, it was verified that even when the sputtering film deposition was conducted for 5 hours, abnormal discharge was significantly suppressed (twice at most).

Note that the In—Ce—O-based sputtering targets according to Examples 1 to 8 were obtained by the production method satisfying all the requirements of the "cerium-oxide-powder grinding step," the "mixture-powder-slurry grinding step," the "granulated-powder producing step," the "compact producing step," and the "sintered-body producing step" according to the present invention (see Tables 1-1 and 1-2).

(2) In contrast, although the In—Ce—O-based sputtering targets according to Comparative Examples 1 and 2 were obtained by the production method satisfying all the requirements of the "cerium-oxide-powder grinding step," the "mixture-powder-slurry grinding step," the "granulated-powder producing step," the "compact producing step," and the "sintered-body producing step" according to the present invention (see Tables 1-1 and 1-2), the Ce content based on the atomic ratio of Ce/(In+Ce) was set outside the range of 0.16 to 0.40 (0.45 in both), and the amount of the cerium oxide powder mixed was too large. Consequently, it was verified that the cerium oxide particles dispersed in the In—Ce—O-based sputtering target had a crystal particle diameter exceeding 5.0 μm (5.2 μm in Comparative Example 1, 5.5 μm in Comparative Example 2), and that the number of times abnormal discharge occurred was significantly high (21 times in Comparative Example 1, 30 times in Comparative Example 2).

(3) Moreover, the In—Ce—O-based sputtering targets according to Comparative Examples 3 to 7 were not obtained by the method including the "cerium-oxide-powder grinding step" according to the present invention. In other words, the cerium oxide raw material powder was not subjected to the pulverizing process (the 90% cumulative particle diameter determined from the particle size distribution was 1.2 μm). Consequently, it was verified that the cerium oxide particles dispersed in the In—Ce—O-based sputtering target had a crystal particle diameter exceeding 5.0 μm (5.3 to 8.0 μm: see data in Table 1), and that the number of times abnormal discharge occurred was significantly high (12 to 101 times: see data in Table 1-2).

(4) In the In—Ce—O-based sputtering target according to Comparative Example 8, the Ce content based on the atomic ratio of Ce/(In+Ce) was set to "0.13" outside the range of 0.16 to 0.40, so that the amount of the cerium oxide powder mixed was too small. Consequently, it was verified that the targeted high-refractive-index transparent conductive film was not obtained (the transparent conductive film of Comparative Example 8 had a refractive index of 2.0 at a wavelength of 550 nm). Note that it was also verified that since the amount of the cerium oxide powder mixed was too small, abnormal discharge did not occur much (once), even though the cerium oxide raw material powder was not pulverized.

(5) The In—Ce—O-based sputtering target according to Comparative Example 9 was not obtained by the method including the "cerium-oxide-powder grinding step" according to the present invention. In other words, the cerium oxide raw material powder was ground into an excessively ground state (the 90% cumulative particle diameter determined from the particle size distribution was 0.4 μm). Consequently, it was verified that the cerium oxide particle diameter in the sintered body increased due to abnormal grain growth, and that the sintered body thus having a low relative density also increased the number of times abnormal discharge occurred (420 times).

(6) The In—Ce—O-based sputtering target according to Comparative Example 10 was not obtained by the method including the "cerium-oxide-powder grinding step" and the "mixture-powder-slurry grinding step" according to the present invention. In other words, the cerium oxide raw material powder was not subjected to the pulverizing process (the 90% cumulative particle diameter determined from the particle size distribution was 1.2 μm). The indium oxide powder and the cerium oxide powder in a mixed state were ground for a long period from the beginning, so that the indium oxide powder was brought into an excessively ground state (the 90% cumulative particle diameter of the mixture powder determined from the particle size distribution was 0.5 μm). Even though the cerium oxide particles in the sintered body were 5 μm or less, abnormal grain growth occurred, greatly decreasing the relative density of the sintered body. Accordingly, it was verified that the number of times abnormal discharge occurred was increased (51 times).

POSSIBILITY OF INDUSTRIAL APPLICATION

The In—Ce—O-based sputtering target according to the present invention enables, by a DC sputtering method, film formation stable and capable of suppressing nodules and abnormal discharge, even though the Ce content based on the atomic ratio of Ce/(In+Ce) is set in a range of "0.16 to 0.40" exceeding 0.15. Thus, the In—Ce—O-based sputtering target according to the present invention has an industrial applicability that it is possible to provide a high-quality, high-refractive-index transparent conductive film at low cost in an industrial scale.

The invention claimed is:

1. An In—Ce—O-based sputtering target comprising an In—Ce—O-based oxide sintered body containing indium oxide as a main component and cerium,
wherein a Ce content of the In—Ce—O-based oxide sintered body based on an atomic ratio of Ce/(In+Ce) is 0.16 to 0.40, and
cerium oxide particles having a particle diameter of 5 μm or less are dispersed in the In—Ce—O-based oxide sintered body.

2. The In—Ce—O-based sputtering target according to claim 1, wherein the In—Ce—O-based oxide sintered body has a relative density of 95% or more, and a specific resistance of from 7 mΩ·cm or more to 50 mΩ·cm or less.

3. A method for producing the In—Ce—O-based sputtering target according to claim 1, wherein the production method comprises:

a cerium-oxide-powder grinding step of grinding a cerium oxide raw material powder by a wet grinding method until a 90% cumulative particle diameter (D90) determined from a particle size distribution reaches from 0.5 μm or more to 1.0 μm or less;
a mixture-powder-slurry grinding step of grinding a mixture powder slurry by the wet grinding method until a 90% cumulative particle diameter (D90) determined from a particle size distribution reaches from 0.7 μm or more to 1.0 μm or less, the mixture powder slurry obtained by mixing the ground cerium oxide powder with an indium oxide raw material powder;
a granulated-powder producing step of obtaining a granulated powder by adding an organic binder to the ground mixture powder slurry, followed by spray drying;
a compact producing step of obtaining a compact by press-molding the obtained granulated powder; and
a sintered-body producing step of obtaining an In—Ce—O-based oxide sintered body by sintering the obtained compact.

4. The method for producing the In—Ce—O-based sputtering target according to the claim 3, wherein the 90% cumulative particle diameter (D90) of the cerium oxide powder determined from the particle size distribution in the cerium-oxide-powder grinding step satisfies $0.5\ (\mu m) \leq D90 \leq -1.5 \times A + 1.15\ (\mu m)$, where A represents the atomic ratio of Ce/(In+Ce), and wherein $0.16 \leq A \leq 0.40$.

5. The In—Ce—O-based sputtering target according to claim 1, wherein the cerium oxide particles dispersed in the In—Ce—O-based oxide sintered body have a particle diameter of 4 μm or less.

6. The In—Ce—O-based sputtering target according to claim 2, wherein the cerium oxide particles dispersed in the In—Ce—O-based oxide sintered body have a particle diameter of 4 μm or less.

* * * * *